(12) United States Patent
Schmenn et al.

(10) Patent No.: US 10,593,615 B2
(45) Date of Patent: Mar. 17, 2020

(54) CHIP PACKAGE WITH SIDEWALL METALLIZATION

(71) Applicant: Infineon Technologies AG, Neubiberg (DE)

(72) Inventors: Andre Schmenn, Sachsenkam (DE); Damian Sojka, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/970,413

(22) Filed: May 3, 2018

(65) Prior Publication Data
US 2018/0323136 A1    Nov. 8, 2018

(30) Foreign Application Priority Data

May 5, 2017    (DE) .................. 10 2017 109 670

(51) Int. Cl.
| | |
|---|---|
| *H01L 21/48* | (2006.01) |
| *H01L 23/498* | (2006.01) |
| *H01L 23/00* | (2006.01) |
| *H01L 21/78* | (2006.01) |
| *H01L 23/12* | (2006.01) |
| *H01L 23/14* | (2006.01) |

(52) U.S. Cl.
CPC .... *H01L 23/49805* (2013.01); *H01L 21/4846* (2013.01); *H01L 21/78* (2013.01); *H01L 23/12* (2013.01); *H01L 24/03* (2013.01); *H01L 24/05* (2013.01); *H01L 24/83* (2013.01); *H01L 23/147* (2013.01); *H01L 2224/13101* (2013.01); *H01L 2224/16245* (2013.01)

(58) Field of Classification Search
CPC ..... H01L 21/4846; H01L 21/78; H01L 23/12; H01L 23/49805; H01L 24/83; H01L 24/05; H01L 24/03; H01L 2224/16245; H01L 2224/13101; H01L 2924/014
See application file for complete search history.

(56) References Cited

U.S. PATENT DOCUMENTS

| | | | |
|---|---|---|---|
| 8,507,316 B2 | 8/2013 | Chu et al. | |
| 2006/0043509 A1* | 3/2006 | Watkins | H01L 24/94 257/431 |
| 2006/0094165 A1 | 5/2006 | Hedler et al. | |
| 2009/0057890 A1* | 3/2009 | Maebashi | H01L 21/6835 257/737 |
| 2009/0160050 A1* | 6/2009 | Miyakawa | H01L 21/76898 257/737 |

(Continued)

*Primary Examiner* — Ahmed N Sefer
(74) *Attorney, Agent, or Firm* — Dicke, Billig & Czaja, PLLC

(57) ABSTRACT

A chip package and manufacturing method is disclosed. In one example, the method includes forming a carrier wafer with a plurality of trenches, each trench being at least partially covered with an electrically conductive sidewall coating. A semiconductor wafer is bonded on a front side of the carrier wafer. An electrically conductive connection structure is formed, including at least partially bridging a gap between the electrically conductive sidewall coating and an integrated circuit element of a respective one of the electronic chips. Material on a backside of the carrier wafer is removed to singularize the bonded wafers at the trenches into a plurality of semiconductor devices.

20 Claims, 12 Drawing Sheets

(56) References Cited

U.S. PATENT DOCUMENTS

2011/0193221 A1    8/2011  Hu et al.
2014/0070405 A1*  3/2014  Agarwal ................. H01L 24/94
                                                             257/737

* cited by examiner

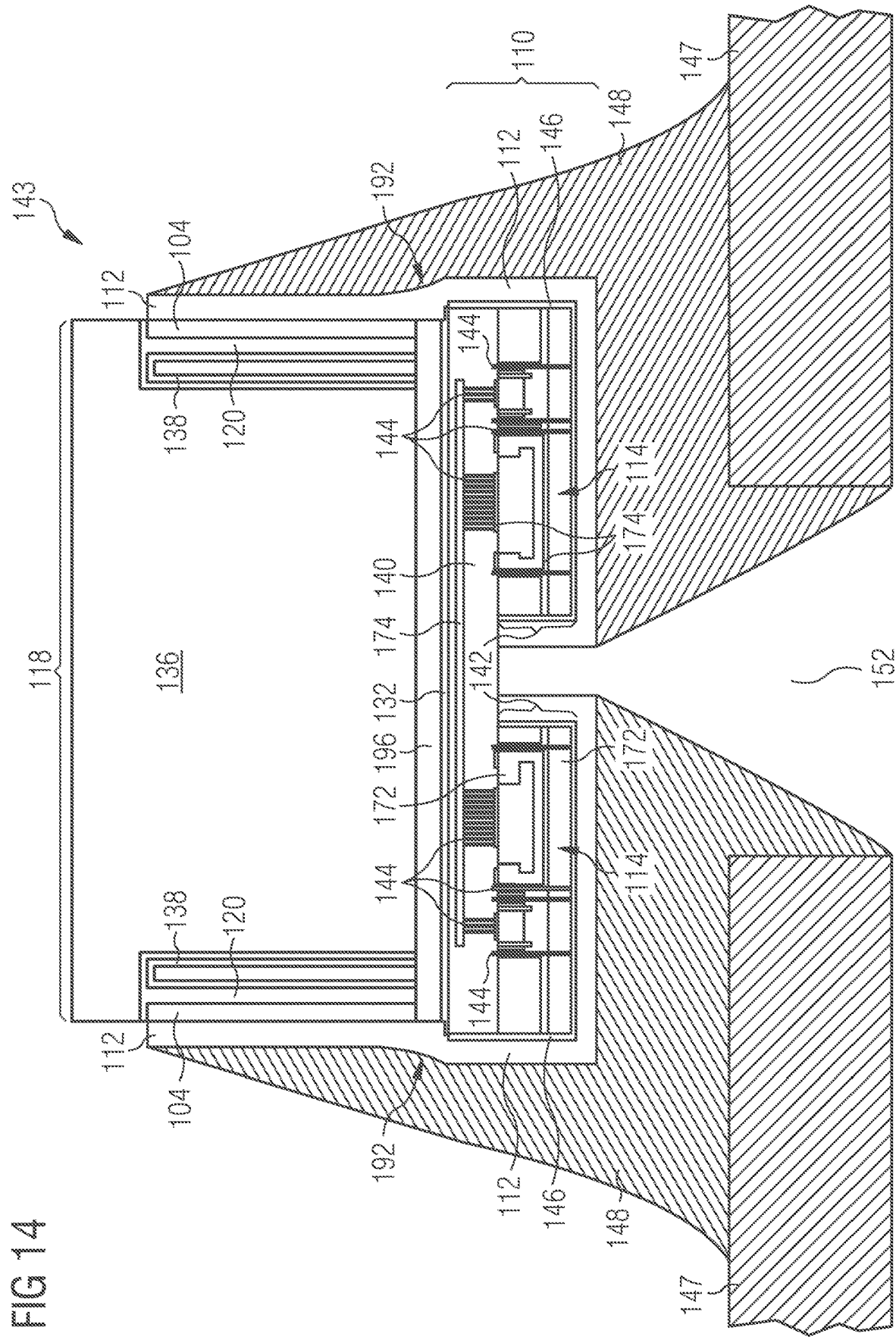

CHIP PACKAGE WITH SIDEWALL METALLIZATION

CROSS-REFERENCE TO RELATED APPLICATION

This Utility Patent Application claims priority to German Patent Application No. 10 2017 109 670.1, filed May 5, 2017, which is incorporated herein by reference.

FIELD OF THE INVENTION

The present invention relates to a manufacturing method, an intermediate product, a semiconductor device, and an electronic device.

BACKGROUND

Conventional semiconductor devices, such as mold structures, for electronic chips have evolved to a level where the package no longer significantly impedes the performance of the electronic chips. Moreover, processing electronic chips on wafer level is a known procedure for efficiently producing them. Etching electronic chips is a conventional technique for removing material therefrom. Encapsulating electronic chips during package manufacture may protect them against the environment.

In another technology, non-encapsulated semiconductor devices are used comprising a semiconductor body having an integrated circuit therein.

There is still potentially room to reduce manufacturing cost and simplify processing of electronic chips while maintaining a high accuracy of the processing. Moreover, it becomes more and more challenging to electrically mount smaller and smaller semiconductor devices on a device carrier such as a printed circuit board.

BRIEF DESCRIPTION OF THE DRAWINGS

The accompanying drawings, which are included to provide a further understanding of exemplary embodiments and constitute a part of the specification, illustrate exemplary embodiments.

In the drawings:

FIG. 14 shows a cross-sectional view of an electronic device composed of a Chip-Scale-Package semiconductor device, and a leadframe, as a device carrier for the semiconductor device, according to another exemplary embodiment.

DETAILED DESCRIPTION OF EXEMPLARY EMBODIMENTS

Figure 1:
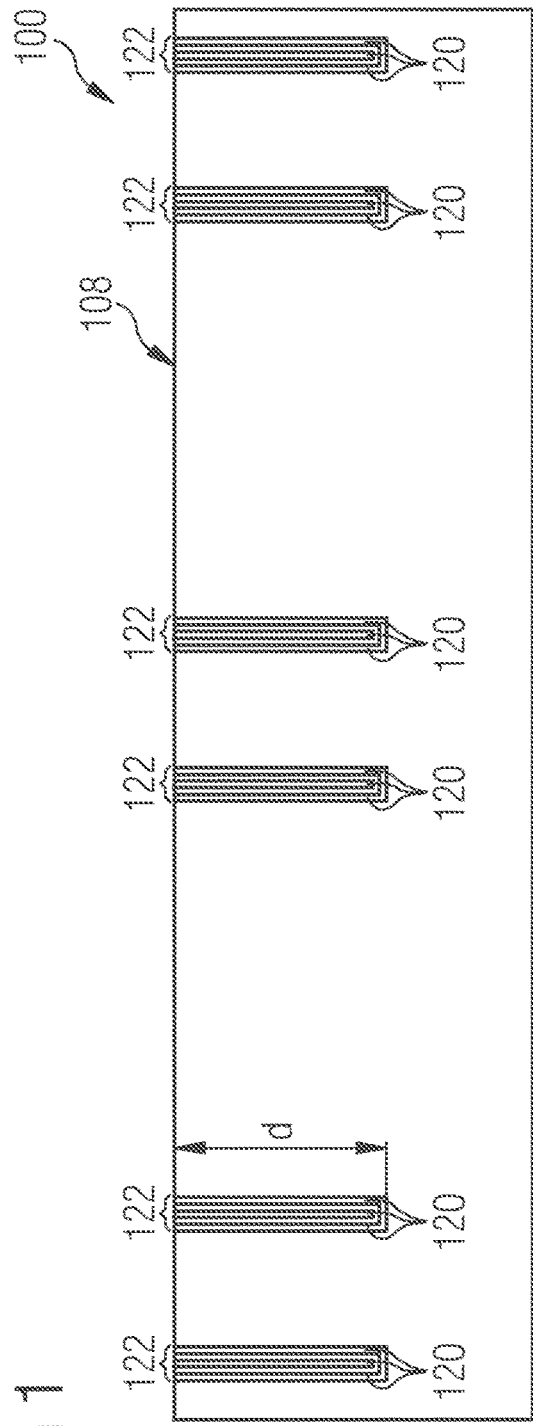
FIG. 1 to FIG. 4 show cross-sectional views of a carrier wafer obtained during carrying out a method of manufacturing semiconductor devices according to an exemplary embodiment.

There is be a need for a reliable method of manufacturing compact semiconductor devices which can be properly mounted on a device carrier.

According to an exemplary embodiment, a manufacturing method is provided which comprises forming a carrier wafer with a plurality of trenches, each trench being at least partially covered with an electrically conductive sidewall coating, bonding a semiconductor wafer on a front side of the carrier wafer so that each of a plurality of electronic chips of the semiconductor wafer is aligned with respect to a respective one of the trenches, forming an electrically conductive connection structure at least partially bridging a gap between the electrically conductive sidewall coating and an integrated circuit element of a respective one of the electronic chips, and removing material on a backside of the carrier wafer to thereby singularize the bonded wafers at the trenches into a plurality of semiconductor devices.

According to another exemplary embodiment, an intermediate product is provided which comprises a carrier wafer with a plurality of trenches, each trench being at least partially covered with an electrically conductive sidewall coating, a semiconductor wafer bonded on a front side of the carrier wafer so that each of a plurality of electronic chips of the semiconductor wafer is aligned with respect to a respective one of the trenches, and an electrically conductive connection structure at least partially bridging a gap between the electrically conductive sidewall coating and an integrated circuit element of a respective one of the electronic chips.

According to yet another exemplary embodiment, a non-encapsulated semiconductor device is provided which comprises a carrier body with a sidewall being at least partially covered with an electrically conductive sidewall coating, an electronic chip bonded on a base wall of the carrier body, and an electrically conductive connection structure at least partially bridging a gap between the electrically conductive sidewall coating and an integrated circuit element of the electronic chip.

According to still another exemplary embodiment, an electronic device is provided which comprises a device carrier and a non-encapsulated semiconductor device having the above-mentioned features and being mounted (in particular by soldering) on the device carrier at least partially by a portion of the electrically conductive connection structure arranged on the sidewall coating.

According to an exemplary embodiment, a manufacturing architecture for non-encapsulated semiconductor devices is provided which allows to produce such devices in a highly compact manner without issues related to the mounting of such semiconductor devices on a device carrier such as printed circuit board. In order to achieve these advantageous effects, the semiconductor devices may be composed of a carrier body with an electrically conductive sidewall coating. On the carrier body, an electronic chip with at least one integrated circuit element is mounted. An electric connection between the electronic chip and the sidewall coating is accomplished at least partially by an electrically conductive contact structure formed in a surface region in between. As a result, a semiconductor device is obtained which can be mounted on a device carrier using also the sidewall metallization for establishing an electric contact. Since the dimension of the sidewall coating can be freely defined by the depth of a trench formed in a carrier wafer as a preform of the carrier body, the dimension of the sidewall coating does not disturb a further miniaturization of the lateral size of the electronic chip on the device carrier. Thereby, a highly compact semiconductor device can be manufactured without involving issues related to the mounting of such small semiconductor devices on a device carrier.

Advantageously, such semiconductor devices may be formed in an efficient batch procedure, i.e. on the basis of a carrier wafer and a semiconductor wafer. The carrier wafer may define the various carrier bodies delimited by trenches. The semiconductor body may comprise the plurality of electronic chips. By the formation of the trenches, not only the electrically conductive sidewall coating can be formed easily and free on scale, but additionally a back side thinning of the carrier wafer up to the bottom of the trench allows to singularize the individual semiconductor devices at the trenches of the bonded wafers.

In view of the concept of exemplary embodiments of providing a carrier wafer and a semiconductor wafer separately, a high freedom of design is obtained for separately optimizing both wafers with regard to their specific characteristics and functions. A further advantage of exemplary embodiments is the opportunity to provide semiconductor devices which can be solder connected with a device carrier partially on a bottom surface and partially on a side wall surface of the semiconductor device for improving electrical reliability. This is particularly advantageous in view of the continuous miniaturization of semiconductor devices (in particular when embodied as non-encapsulated semiconductor pieces, for instance as CSP package), because the solder area only on a bottom surface of such packages can become critically low when the dimensions of the package become low.

In the context of the present application, the term "non-encapsulated semiconductor device" may particularly denote a semiconductor chip in which a semiconductor chip (i.e. a naked die in which at least one monolithically integrated circuit can be formed) is provided with an electric coupling structure, but is not encapsulated by a mold compound, a laminate, or another encapsulant. However, the non-encapsulated semiconductor device may be covered with a layer of varnish or the like (which may be applied for instance by spraying after singularization). It is also possible that the non-encapsulated semiconductor device is covered with a (for instance black) backside protection foil (BSP foil).

In the following, further exemplary embodiments of the method, the intermediate product, the semiconductor device, and the electronic device will be explained.

In an embodiment, the method comprises forming the carrier wafer by forming first auxiliary trenches and filling the first auxiliary trenches at least partially with electrically insulating material, forming second auxiliary trenches laterally neighboured to the first auxiliary trenches and filling the second auxiliary trenches at least partially with the electrically conductive sidewall coating, and subsequently forming the trenches between respectively two neighboured second auxiliary trenches so that two opposing sidewalls of the respective trench are at least partially covered with the electrically conductive sidewall coating. By the concept of the formation of auxiliary trenches, it can be ensured that the electrically conductive sidewall coating of the trenches is arranged on top of an electrically conductive sidewall isolation. Thereby, undesired electric paths from the sidewall coating to an interior of the carrier bodies may be safely prevented, thereby improving the electronic performance. This particularly holds when the material of the carrier bodies is not purely dielectric, for instance is made of a semiconductor material.

In an embodiment, the method comprises forming the main or separation trenches extending deeper into the carrier wafer than the first and second auxiliary trenches. When forming the trenches deeper than the auxiliary trenches, it can be ensured that an extension of the trenches into the carrier wafer is deeper than an extension of the electrically conductive sidewall coating. By taking this measure, it can be ensured that during a subsequent back side thinning of the carrier wafer for singularizing the individual semiconductor devices, it is not necessary to grind electrically conductive material of the electrically conductive sidewall coating, but only homogeneous material of the carrier wafer. Thereby, a highly reliable and reproducible electrically conductive sidewall coating may be formed.

In an embodiment, the first auxiliary trenches are filled with the electrically insulating material by oxidizing exposed walls of the carrier wafer followed by deposition of further electrically insulating material. The oxidation of the sidewalls of the auxiliary trenches may be accomplished by a thermal treatment, for instance oxidizing silicon to silicon oxide. In order to further improve the electrical decoupling between the electrically conductive sidewall coating and an interior of the carrier bodies, a subsequent deposition of electrically insulating material, for instance made of silicon nitride, may be carried out.

In an embodiment, the second auxiliary trenches are partially filled with electrically insulating material by oxidizing exposed walls of the carrier wafer. Thus, also the second trenches may be electrically insulated by a thermal treatment of their surface, thereby converting the material of the carrier wafer into an electrically insulating oxide (for instance silicon into silicon oxide).

In an embodiment, the method comprises bonding the semiconductor wafer on the front side of the carrier wafer so that the integrated circuit elements are exposed on a main surface of the semiconductor wafer opposing a bonding surface of the semiconductor wafer. By taking this measure, it can be ensured that the integrated circuit elements are not harmed, damaged or deteriorated by the bonding procedure (which may involve a certain adhesive material or the like). Moreover, this ensures that the integrated circuit elements remain exposed at an exterior surface of the bonded wafers, which simplifies formation of the electrically conductive contact structure merely along a surface of the bonded wafers.

In an embodiment, the method comprises, in particular prior to forming the electrically conductive connection structure, forming through holes in the semiconductor wafer so that the through holes flush with the trenches. This formation of the through holes in the semiconductor wafer after wafer bonding ensures, that the singularization of the bonded wafers into the individual semiconductor devices can be accomplished by a simple back side thinning (for instance by grinding) of the bonded wafers without taking any further measures.

In an embodiment, the method comprises forming the electrically conductive connection structure by seed metal deposition followed by electroless plating. With such a procedure, it is possible to firstly prepare the surface of the bonded wafers for electroless plating by forming an electrically conductive seed metal layer. On such a seed layer, formation of a sufficiently thick electrically conductive connection structure by electroless plating can be promoted. Such a sufficiently thick electrically conductive connection structure allows for a low ohmic coupling of the integrated circuit elements of the electronic chip with a device carrier on which the semiconductor device is mounted.

In an embodiment, the method comprises bonding the semiconductor wafer on the carrier wafer by gluing. Thus, a layer of electrically insulating glue or adhesive may be sandwiched between the carrier wafer and the semiconductor wafer. This ensures a reliable connection between carrier bodies and electronic chips, thereby preventing an undesired delamination of the constituents of the semiconductor device.

In an embodiment, the method comprises removing the material of the carrier wafer by grinding. Grinding is a mechanical abrasion technique allowing to homogeneously remove material from the back side of the bonded wafers. Thereby, the formation of semiconductor devices of homogeneous thickness can be ensured. As an alternative to grinding, other singularization techniques may be used, such as sawing, cutting, etching, laser separation, etc.

In an embodiment, the semiconductor device is configured as a Chip-Scale-Package (CSP package). In order to qualify as chip scale, the package should have an area no greater than 1.2 times that of the die or electronic chip and it shall be a single-die, direct surface mountable package. Another criterion that may be applied to qualify a package as a CSP package is its ball pitch should be no more than 1 mm. In particular, a CSP package may have a dimension which is not more than 20% larger than a dimension of the electronic chip thereof. A CSP package is usually non-encapsulated and can therefore be provided with a very small thickness. Consequently, a CSP package is highly appropriate for applications such as wearables, portable devices, watches, smart glasses, etc.

In an embodiment, two opposing sidewalls of the carrier body are covered at least partially with the electrically conductive sidewall coating. By using both opposing sidewalls of a semiconductor device for the formation of an electrically conductive contact structure, a low ohmic electric coupling with a device carrier may be achieved. Moreover, with the use of both opposing main surfaces for electrical contact purposes, even sophisticated electronic functions may be made possible.

In an embodiment, the semiconductor device comprises a circumferential electrically insulating annulus sandwiched between the electrically conductive sidewall coating and the carrier body. With such a ring-shaped electrical insulating barrier around the entire perimeter of the semiconductor device, a reliable prevention of undesired electrical paths of the semiconductor device may be safely prevented. Thereby, the electric performance of the semiconductor device may be improved.

In an embodiment, a surface of the semiconductor device has an area of not more than 0.3 mm×0.15 mm. Thus, highly compact semiconductor devices can be formed with an extremely high yield of semiconductor devices per semiconductor wafer area. At the same time, no issues in terms of assembling such semiconductor devices on a device carrier such as a PCB occur, since this mounting can be supported by the sidewall coating. The latter can be rendered relatively large and can be scaled by simply adjusting the depth of the trench.

In an embodiment, the electrically conductive connection structure uninterruptedly bridges the gap between the electrically conductive sidewall coating and the integrated circuit elements. Such an embodiment, which is shown for instance in FIG. 1 to FIG. 12 and FIG. 14, has the advantage that a very reliable electric connection is established.

In another embodiment, the electrically conductive connection structure bridges only part of the gap between the electrically conductive sidewall coating and the integrated circuit element so that an electrically non-conductive space remains in between (in particular at a surface portion which is not composed of electrically conductive material, but of electrically insulating material). Such an embodiment, which is shown for instance in FIG. 13, does not require adjusting the process so that plating material reliably closes the remaining space. A sufficient electric contact may then be established by a solder material or the like which couples a device carrier with both the electrically conductive sidewall coating and the electrically conductive connection structure during assembly. Thus, a high electric performance may be obtained even without the need of precisely adjusting the process of forming the electrically conductive connection structure.

In an embodiment, the electrically conductive connection structure at least comprises at least one sidewall section and at least one base wall section (wherein in the context of the present application, a base wall may be a top wall and/or a bottom wall extending orthogonal to a sidewall, in particular extending horizontally) extending perpendicular to at least one sidewall section. Thus, the electrically conductive connection structure may be an angled structure and may have a horizontal base wall section which may directly connected to the electronic chip. A vertical side wall section may be connected to the sidewall section and may be located at least partially on the sidewall coating.

Figure 13:
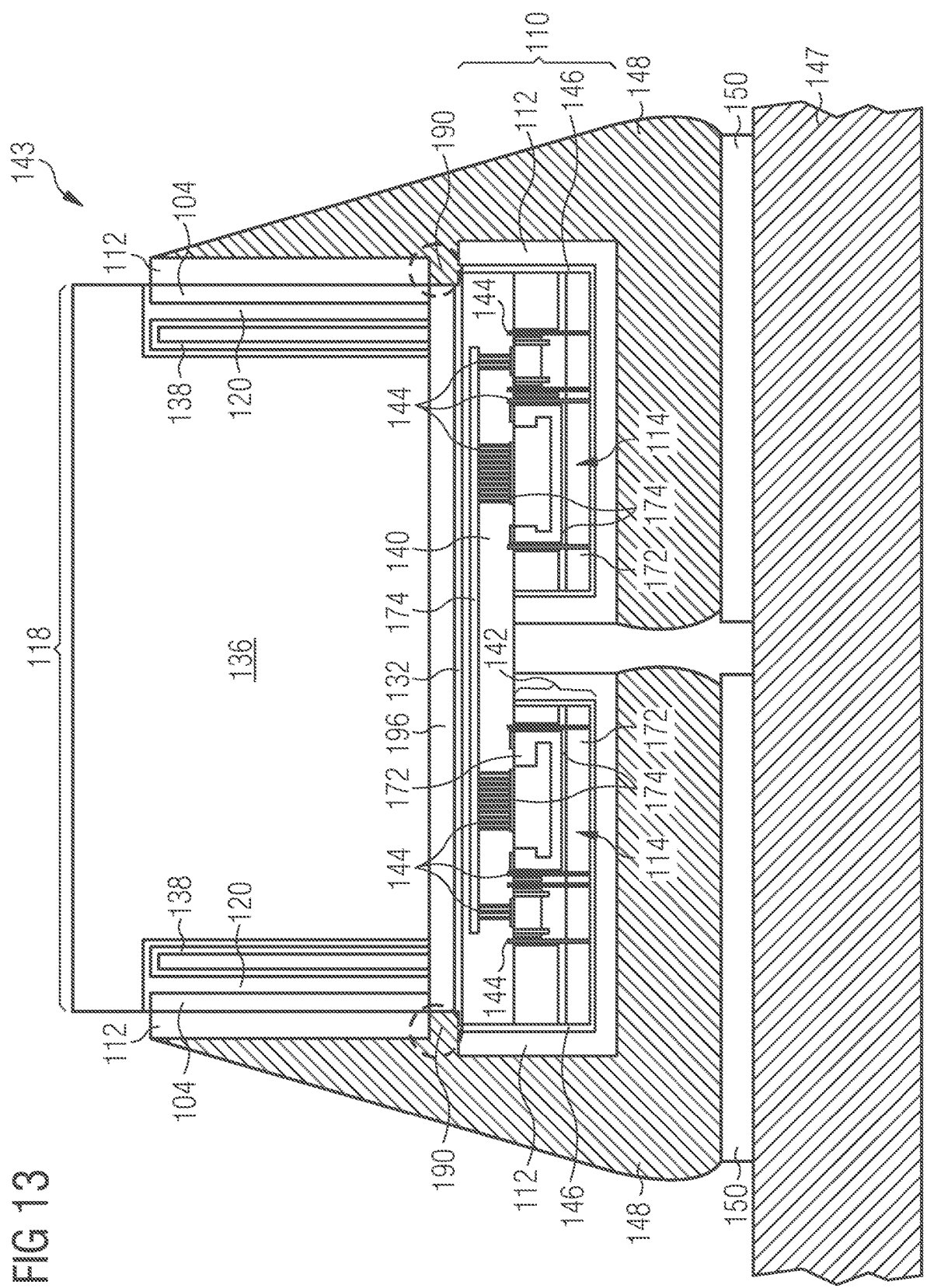
FIG. 13 shows a cross-sectional view of an electronic device composed of a Chip-Scale-Package, as a surface mounted semiconductor device, and a printed circuit board (PCB), as a device carrier for the semiconductor device, according to an exemplary embodiment.

In an embodiment, the device carrier is a printed circuit board (see FIG. 13). A printed circuit board is an appropriate mounting base for the semiconductor devices, wherein a pad of the PCB can be electrically connected (at least also) to the sidewall coating of the semiconductor device. However, other device carriers are possible as well, for instance a leadframe (see FIG. 14).

In an embodiment, the electronic device comprises a solder structure connecting the device carrier at least with the portion of the electrically conductive connection structure on the sidewall coating. Thus, the electrically conductive surface metallization may be configured to be suitable for establishing a solder connection with a counter area of the device carrier.

In an embodiment, the semiconductor device is mounted on the device carrier partially by a portion of the electrically conductive connection structure being not arranged on the sidewall coating. In such an embodiment, the semiconductor device is mechanically mounted in a very stable way partially on a sidewall portion and partially on a base wall portion of the connection structure. Highly advantageously, also the electric connection of the semiconductor device may be accomplished partially by the sidewall metallization and partially by the base wall metallization. This ensures a high reliability in terms of mechanical stability and electrical reliability of the manufactured electronic device.

In an embodiment, the electronic chip is configured as a controller chip, a processor chip, a memory chip, a sensor chip or a micro-electromechanical system (MEMS). In an alternative embodiment, it is also possible that the electronic chip is configured as a power semiconductor chip. Thus, the electronic chip (such as a semiconductor chip) may be used for power applications for instance in the automotive field and may for instance have at least one integrated insulated-gate bipolar transistor (IGBT) and/or at least one transistor of another type (such as a MOSFET, a JFET, etc.) and/or at least one integrated diode. Such integrated circuit elements may be made for instance in silicon technology or based on wide-bandgap semiconductors (such as silicon carbide, gallium nitride or gallium nitride on silicon). A semiconductor power chip may comprise one or more field effect transistors, diodes, inverter circuits, half-bridges, full-bridges, drivers, logic circuits, further devices, etc.

In one embodiment, the device carrier may be configured as a printed circuit board (PCB). However, other kinds of device carriers may be used as well. For example, the semiconductor devices may also be mounted on and/or in other device carriers such as a chip card. Such a chip card may for example comprise a chip or semiconductor device and an antenna, etc.

As substrate or wafer forming the basis of the electronic chips, a semiconductor substrate, preferably a silicon substrate, may be used. Alternatively, a silicon oxide or another insulator substrate may be provided. It is also possible to implement a germanium substrate or a III-V-semiconductor material. For instance, exemplary embodiments may be implemented in GaN or SiC technology.

Furthermore, exemplary embodiments may make use of standard semiconductor processing technologies such as appropriate etching technologies (including isotropic and anisotropic etching technologies, particularly plasma etching, dry etching, wet etching), patterning technologies (which may involve lithographic masks), deposition technologies (such as chemical vapor deposition (CVD), plasma enhanced chemical vapor deposition (PECVD), atomic layer deposition (ALD), sputtering, etc.).

The above and other objects, features and advantages of the present invention will become apparent from the following description and the appended claims, taken in conjunction with the accompanying drawings, in which like parts or elements are denoted by like reference numbers.

Before describing further exemplary embodiments in further detail, some basic considerations of the present inventors will be summarized based on which exemplary embodiments have been developed which provide for a manufacturing concept capable of handling and assembling very compact semiconductor devices.

According to an exemplary embodiment, a non-encapsulated semiconductor device (which may also be configured as Chip-Size-Package, CSP) is provided with a side wall metallization in addition to a base wall metallization for simplifying formation of a reliable electrically conductive connection between the semiconductor device and a device carrier on which the semiconductor device may be mounted for forming an electronic device.

Continuing miniaturization in electronics requires smaller packages. Conventionally, the smallest packages for semiconductor devices have dimensions of about 0.4 mm×0.2 mm. For passive devices, even dimensions up to 0.3 mm×0.15 mm are considered. However, there is a demand for even smaller dimensions of active semiconductor devices in the range of 0.3 mm×0.15 mm.

However, with continued further miniaturization, it becomes more and more difficult to reliably mount and electrically connect semiconductor devices on a device carrier such as a printed circuit board (PCB).

In order to meet the above described demands even with continued miniaturization of semiconductor devices, exemplary embodiments provide a metallization at a face-side of a package manufactured in Chip Sale Package (CSP) technology. More specifically, exemplary embodiments provide a manufacturing architecture allowing to form a side wall metallization which can be introduced to improve mounting of ultra-small active semiconductor devices. A gist of an exemplary embodiment is to separate a package production part from an active device production part. This can be achieved by dividing the production of a semiconductor device into a package part and a device part that are bonded together. This may be carried out on wafer level before singularizing a carrier wafer-semiconductor wafer compound into multiple non-encapsulated semiconductor devices. This results in further miniaturized packages or semiconductor devices which nevertheless allow for a reliable electric and mechanical connection with a device carrier such as a PCB. Consequently, an easy PCB assemble procedure may be combined with a further miniaturization and thus more compact semiconductor devices.

Separation of the mentioned wafer-wafer compound into the individual semiconductor devices as well as sidewall metallization for electric connection purposes may be carried out on the basis of the production of metal filled trenches that serve for sidewall metallization as well as for defining singularization positions.

In an exemplary embodiment, the following manufacturing procedure can be carried out:
Produce a carrier wafer that contains trenches with sidewall passivation and sidewall metallization
Assemble the carrier wafer with a semiconductor wafer (which can also be denoted as an active device wafer)
Grind the semiconductor wafer
Electrically connect the sidewall metallization with the integrated circuit elements
Singularize the carrier wafer-semiconductor wafer compound into individual non-encapsulated semiconductor devices.

Such a manufacturing architecture has the advantage that the manufactured semiconductor devices can be easily mounted on a device carrier such as a PCB. Moreover, the described manufacturing process allows for easy optical soldering checks due to visible side wall solder on the PCB or other device carriers. Beyond this, the described manufacturing process makes it possible to produce extremely small packages, since solder limitations of package pad size and distance can be overcome. Apart from this, a very low production effort can be achieved due to a possible massive increase of semiconductor chips per semiconductor wafer (in particular, an area consumption of about 0.3 mm×0.1 mm per semiconductor device of a semiconductor wafer is significantly lower than with a conventional 0.6 mm×0.3 mm configuration).

FIG. 1 to FIG. 4 show cross-sectional views of a carrier wafer 100 obtained during carrying out a method of manufacturing semiconductor devices 118 according to an exemplary embodiment. The carrier wafer 100 may be a silicon wafer, because silicon material is properly suitable for processing such as etching, oxidizing, etc. Alternatively, the carrier wafer 100 may be made of another material such as glass. The latter embodiment has the advantage that glass is reliably electrically insulating, which simplifies processing.

In the shown embodiment, processing of the carrier wafer 100 includes an auxiliary trench etch, an auxiliary trench oxidation, a silicon nitride deposition in the auxiliary trench, an auxiliary trench fill with silicon oxide, an additional auxiliary trench etch, an additional auxiliary trench oxidation, and a metal trench filling procedure. Moreover, a separation trench etching may be carried out using the silicon oxide in the metal filled auxiliary trench as hardmask. The mentioned procedure will be described in the following in further detail:

Referring to FIG. 1, a plurality of first auxiliary trenches 122 are formed (in particular by etching) in the (here: silicon) carrier wafer 100 and are subsequently filled with electrically insulating material 120. More specifically, the first auxiliary trenches 122 are filled with the electrically insulating material 120 by firstly oxidizing exposed walls of the carrier wafer 100 for forming a silicon oxide layer on the exposed surface portions of the first auxiliary trenches 122. Subsequently, further electrically insulating material (preferably silicon nitride) may be deposited on the silicon oxide material. A remaining empty space of the first auxiliary trenches 122 may then be filled with further silicon oxide material. For instance, a depth, d, of the first auxiliary trenches 122 may be in a range between 50 μm and 300 μm, in particular in a range between 175 μm and 220 μm.

Although not shown in FIG. 1, the first auxiliary trenches 122 and their filling with electrically insulating material 120 forms a circumferentially closed annular structure (compare FIG. 11) which prevents undesired current paths during operation of the semiconductor devices 118.

Figure 2:
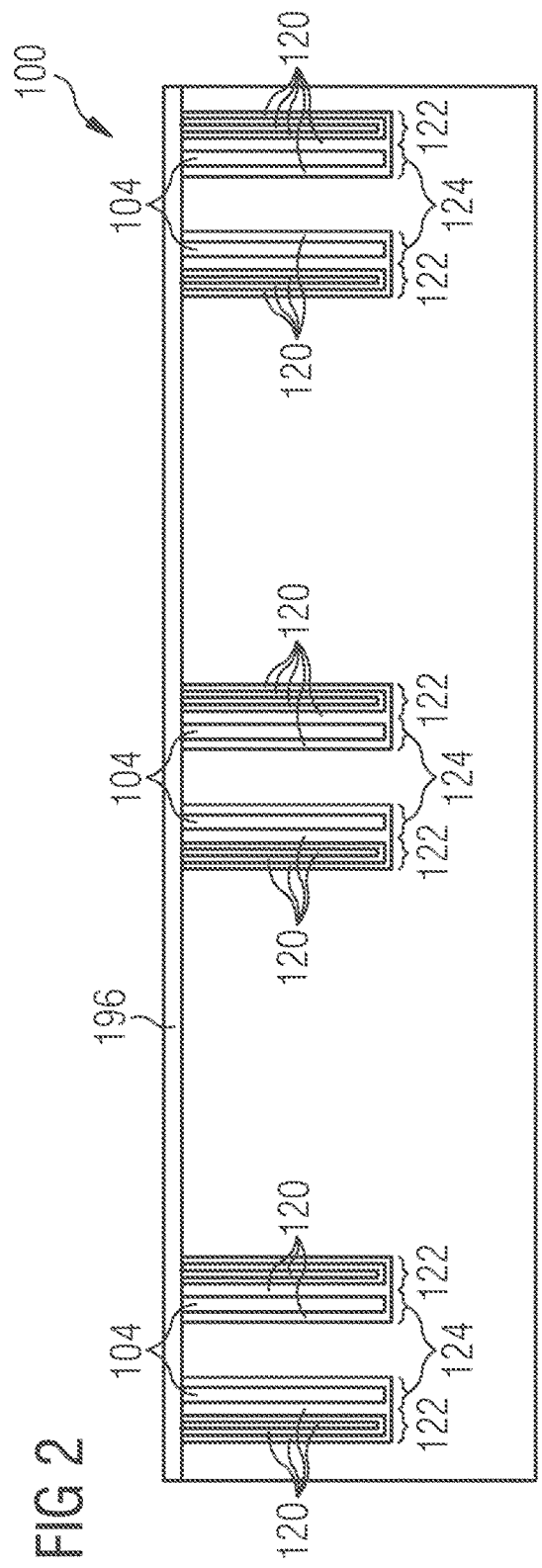

Referring to FIG. 2, second auxiliary trenches 124 may be formed (in particular by an additional etching procedure) in the carrier wafer 100 according to FIG. 1. Each of the second auxiliary trenches 124 is laterally neighboured to a respective one of the first auxiliary trenches 122 and may be formed with the same depth, d. Each of the second auxiliary trenches 124 is subsequently filled partially with an electrically conductive sidewall coating 104 (for instance made of copper material) and partially with further electrically insulating material. More precisely, the second auxiliary trenches 124 are filled with electrically insulating material 120 by oxidizing exposed walls of the carrier wafer 100 (or by deposition of dielectric material), thereby converting exposed silicon material of the carrier wafer 100 into silicon oxide material. Contrary to the first auxiliary trenches 122 their electrically insulating material 120, the second auxiliary trenches 124 and their corresponding electrically insulating material 120 are not arranged in an annular circumferentially surrounding way, but are arranged as isolated sidewall coating regions specifically at those portions where an electrically conductive connection is desired (compare FIG. 11). As can be taken from FIG. 2, the second auxiliary trenches 124 are formed so that two adjacent sidewall coatings 104 are located to face one another. As indicated with reference numeral 196, an optional electrically insulating cover layer (for instance a silicon nitride layer) may be deposited on an exterior upper main surface of the processed carrier wafer 100.

Still referring to FIG. 2, the second auxiliary trenches 124 are formed neighboured to the previously dielectrically filled first auxiliary trenches 122. The second auxiliary trenches 124 are firstly electrically insulated, for instance by a thermal treatment converting the exposed material of the carrier wafer 100 into a corresponding oxide (for instance oxidizing silicon into dielectric silicon oxide). Subsequently, the remaining second auxiliary trenches 124 may be filled with electrically conductive material such as copper, thereby forming the sidewall coating 104.

Figure 3:
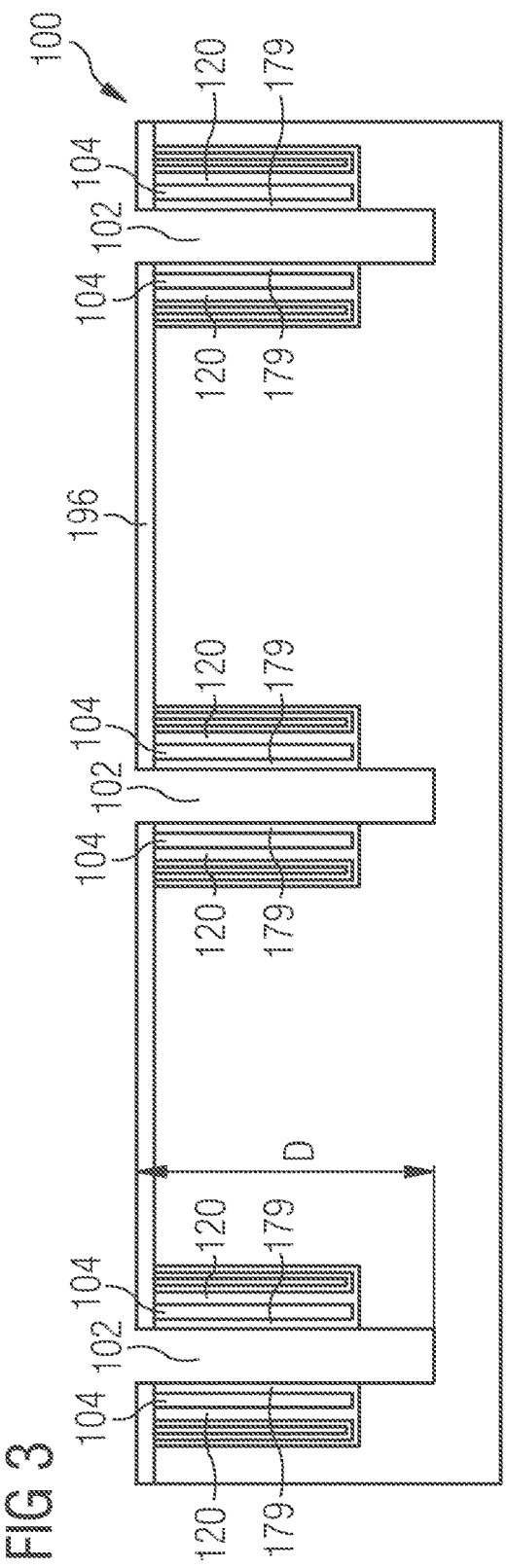

Referring to FIG. 3, a plurality of trenches 102 (which may be denoted as separation trenches or main trenches) are formed in the processed carrier wafer 100 of FIG. 2. These trenches 102 are formed to extend between two respectively adjacent second auxiliary trenches 124 and expose their lateral end portions of electrically insulating material 120 (compare electrically insulating surface layers 179). A corresponding procedure may be denoted as a kerf etch. A depth of the trenches 102, D, may be larger than the depth, d, of the auxiliary trenches 122, 124 (D>d). Thus, the trenches 102 are formed to extend deeper into the carrier wafer 100 than the first and second auxiliary trenches 122, 124. For instance, D may be 10 μm to 20 μm deeper than d. The difference D-d should be large enough to ensure secure separation of the individual semiconductor devices 118 during a dicing by grinding procedure (compare transition from FIG. 9 to FIG. 10) without influencing the electrically conductive material of the sidewall coating 104. Each trench 102 being at least partially covered with an electrically conductive sidewall coating 104, subsequently forming the trenches 102 between respectively two neighboured second auxiliary trenches 124 so that two opposing sidewalls of the respective trench 102 are at least partially covered with the electrically conductive sidewall coating 104.

As can be taken from FIG. 3, the main trenches 102 are formed in the carrier wafer 100 as processed according to FIG. 2 so that the trenches 102 bridge the previously filled auxiliary trenches 122, 124. As can be taken from FIG. 1 to FIG. 3, the depth, D, of the trenches 102 is deeper than the depth, d, of the auxiliary trenches 122, 124 in order to prevent undesired removal of material of the electrically conductive sidewall coating 104 at a subsequent singularization procedure described below referring to FIG. 10. Although not shown in FIG. 3, the main or separation trenches 102 form a circumferential annular structure (compare FIG. 11) and define the outer limits of the individual semiconductor devices 118 under manufacture.

Figure 4:
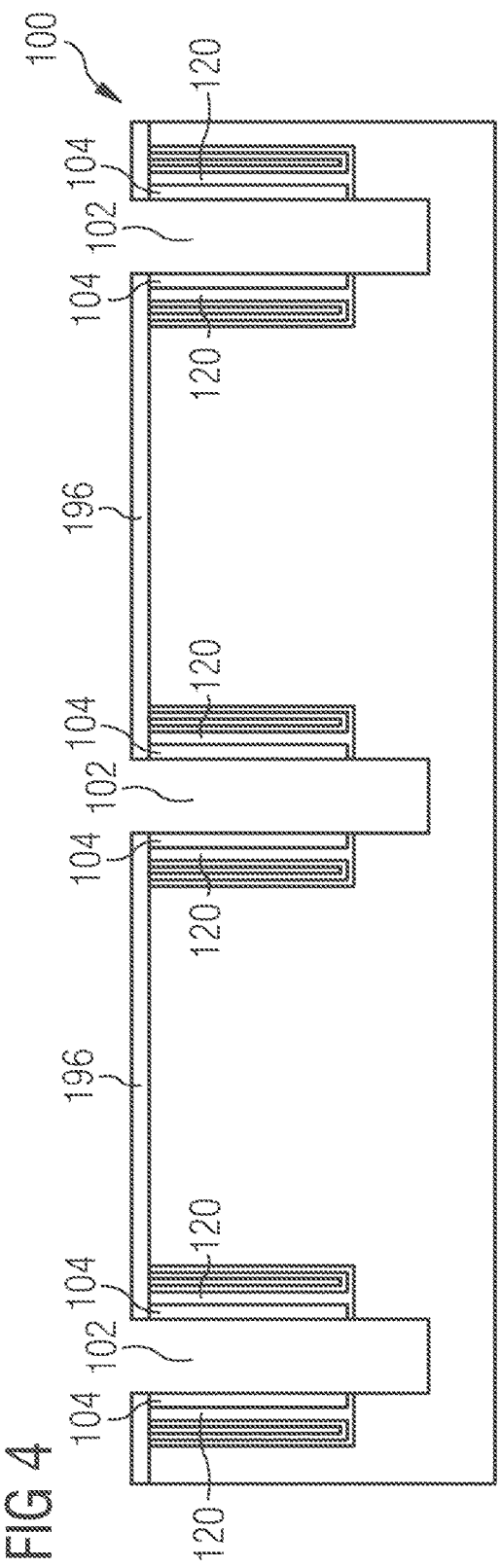

As shown in FIG. 4, the electrically insulating surface layers 179 formed by the previous auxiliary trench filling procedures and exposed by the formation of the main trenches 102 can be removed, for instance by etching. It is however alternatively also possible that the electrically insulating surface layers 179 or silicon oxide protection layers are removed only later. As a result, both opposing vertical walls of the so processed trenches 102 are delimited by the electrically conductive sidewall coating 104.

FIG. 5 to FIG. 10 show cross-sectional views of an intermediate product 134 composed of a semiconductor wafer 106 bonded on the carrier wafer 100 according to FIG. 4 and obtained during continuing the method of manufacturing semiconductor devices 118 according to an exemplary embodiment.

As will be described in the following in further detail, the further production of the semiconductor devices 118 includes:

Glue deposition and structuring on a side or main surface of the carrier wafer 100 according to FIG. 4, on which the semiconductor wafer 106 is to be bonded Bonding the semiconductor wafer 106 to the carrier wafer 100

Backside grinding of the semiconductor wafer 106

Silicon structuring from backside

Silicon oxide structuring from backside

Seed metal deposition and structuring on backside

Removal of passivation from the semiconductor wafer 106 to open the trenches 102 of the carrier wafer 100

Electroless plating on semiconductor wafer 106 (which may also be denoted as device wafer) and metal of the carrier wafer 100

Figure 5:
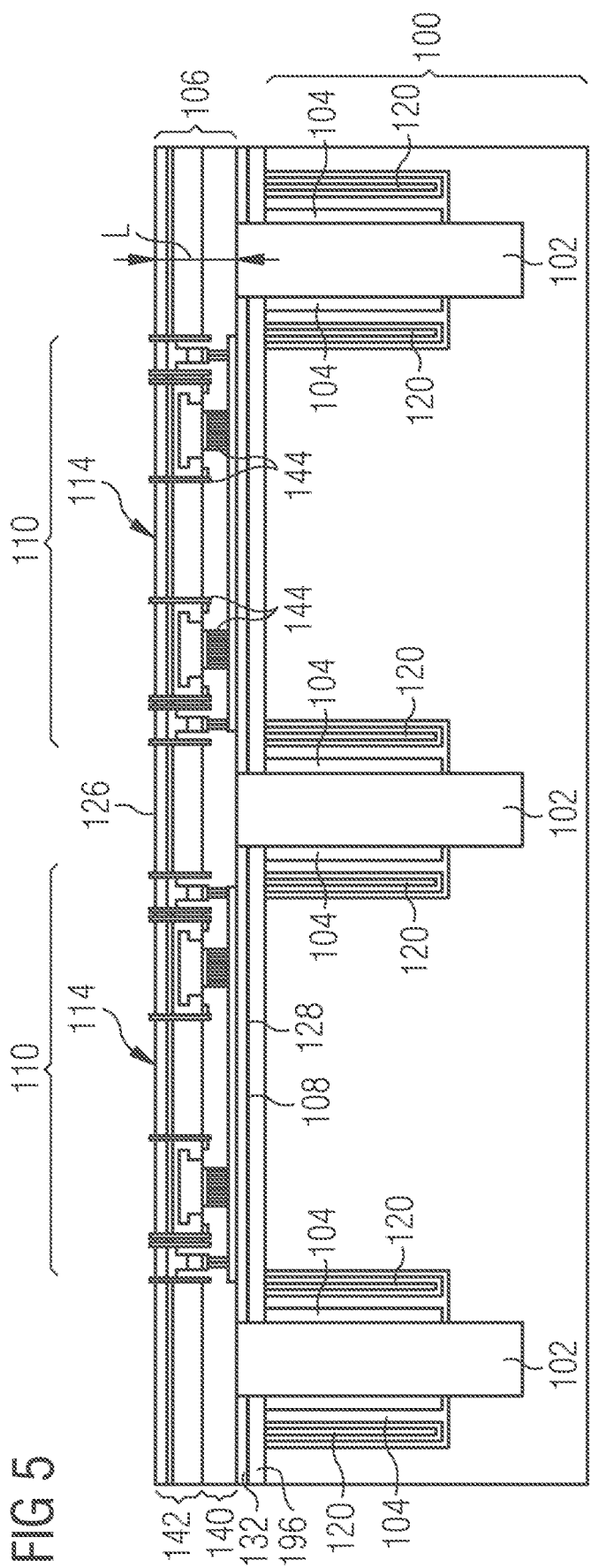
FIG. 5 to FIG. 10 show cross-sectional views of an intermediate product composed of a semiconductor wafer bonded on the carrier wafer according to FIG. 4 obtained during continuing the method of manufacturing semiconductor devices according to an exemplary embodiment.

Separation of the individual semiconductor devices 118 of the carrier wafer 100-semiconductor wafer 106 compound using dicing by grinding Referring to FIG. 5, semiconductor wafer 106 is bonded on a front side 108 (i.e. an upper main surface according to FIG. 5) of the carrier wafer 100 so that each of a plurality of electronic chips 110 of the semiconductor wafer 106 is aligned with respect to a respective one of the main or separation trenches 102, or is arranged between two adjacent ones of the trenches 102. The bonding of the semiconductor wafer 106 on the front side 108 of the carrier wafer 100 is accomplished so that integrated circuit elements 114 of the semiconductor wafer 106 are externally accessible via electrically conductive elements 144 of the integrated circuit elements 114. The electrically conductive elements 144 of the integrated circuit elements 114 are exposed on a main surface 126 of the semiconductor wafer 106 opposing a bonding surface 128 of the semiconductor wafer 106 at which the semiconductor wafer 106 is bonded to the carrier wafer 100. In the shown embodiment, the integrated circuit elements 114 comprise a diode in series with a thyristor.

The detailed configuration of the integrated circuit elements 114 of the electronic chips 110 depends on the electronic application, but will be explained in further detail for the described embodiment referring to FIG. 12. However, it should be said that the electronic chips 110 of the semiconductor wafer 106 comprise an electrically insulating layer 140 (comprising silicon oxide in the described embodiment) and comprises a semiconductor layer 142 (comprising silicon in the described embodiment). Electrically conductive elements 144 (for instance tungsten plugs) are provided for electric connection purposes in both the electrically insulating layer 140 as well as in the semiconductor layer 142.

As already mentioned, readily produced semiconductor wafer 106 is wafer-bonded to carrier wafer 100 prepared according to FIG. 4 by adhering the wafers 100, 106 by the adhesive material 132. The mentioned bonding between the semiconductor wafer 106 and the carrier wafer 100 is accomplished by the layer of dielectric adhesive material 132. For instance, the adhesive material 132 may be applied on the front side 108 of the carrier wafer 100 or on the bonding surface 128 of the semiconductor wafer 106 prior to bonding. It is advantageous, although not mandatory, that the layer of adhesive material 132 is patterned prior to the bonding. It is possible that silicon material on the upper main surface 126 of the semiconductor wafer 106 is removed after the bonding with the carrier wafer 100, for instance by grinding, in order to expose and get access to the integrated circuit elements 114 of the semiconductor wafer 106. Such a thickness reduction can be accomplished easier after the bonding, since handling of an already very thin semiconductor wafer 106 is difficult.

A thickness, L, of the semiconductor wafer 106 may be smaller than the depth, D, of the carrier wafer 100. For instance, L may be in a range between 1 μm and 50 μm, in particular in a range between 12 μm and 15 μm.

Figure 6:
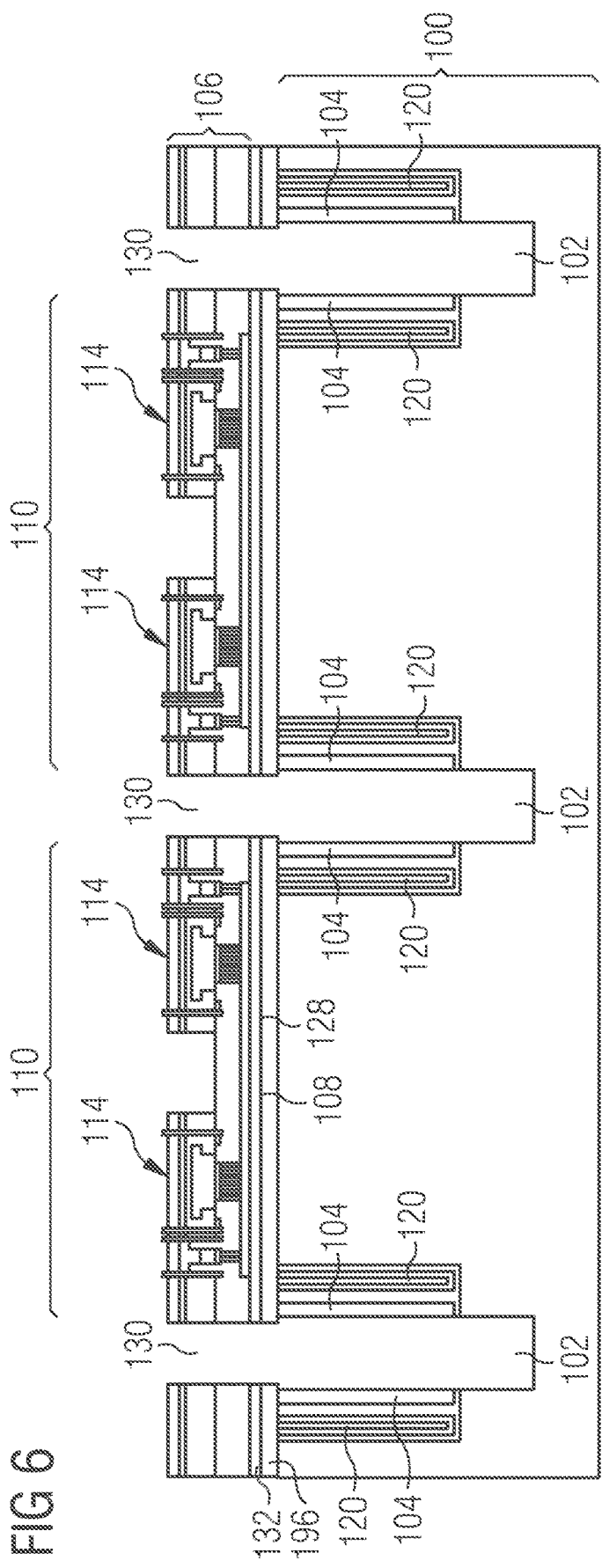

Referring to FIG. 6, through holes 130 are formed in the semiconductor wafer 106 so that the through holes 130 flush or are aligned with the main or separation trenches 102. A corresponding etching process may be a two-stage process, first removing silicon material of the exposed semiconductor layer 142 followed by a removal of silicon oxide material of the electrically insulating layer 140. For instance, the formation of the through holes 130 according to FIG. 6 can be accomplished by a lithography and etching procedure. Alternatively, these through holes 130 may also be formed by laser drilling. Formation of the through holes 130 may remove silicon material and silicon oxide material of the semiconductor wafer 106 at the positions of the trenches 102. This procedure can be considered as a preparation of subsequent singularization of the bonded wafers 100, 106 into separate semiconductor devices 118. The mentioned singularization procedure will be later completed by back side grinding of the carrier wafer 100 (compare the transition of FIG. 9 to FIG. 10).

Figure 7:
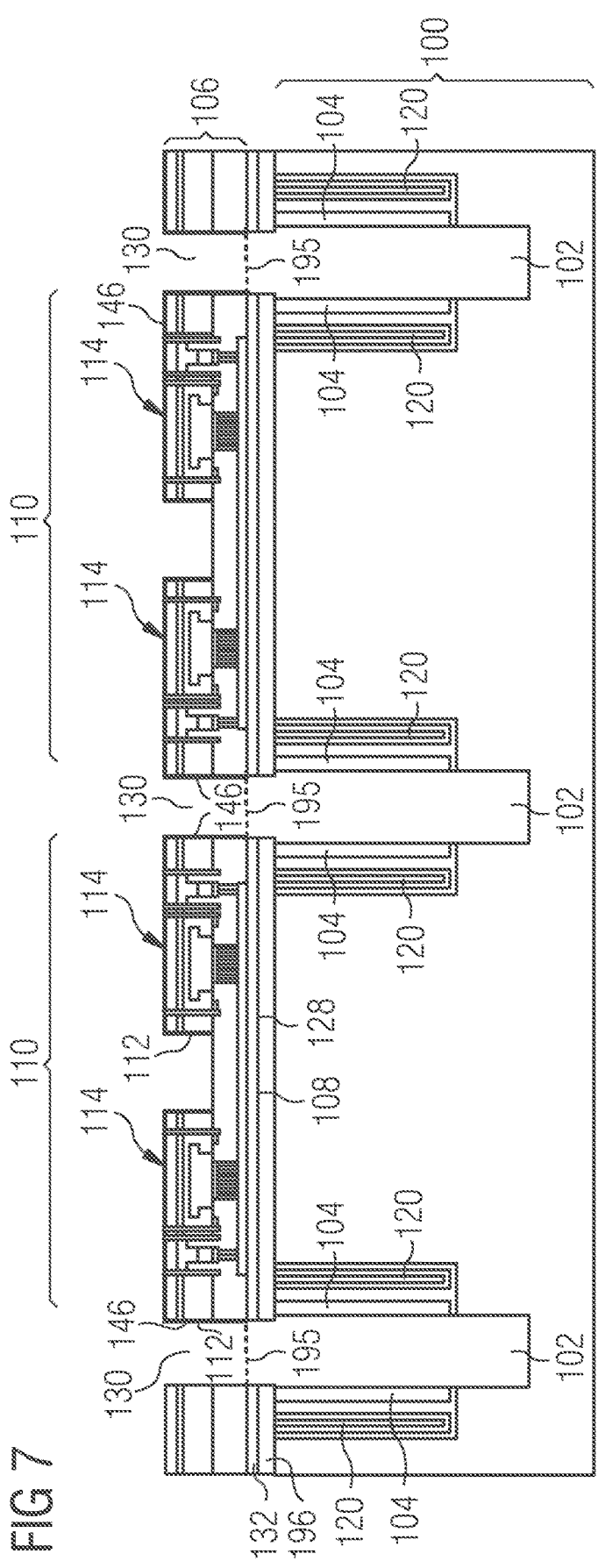

Referring to FIG. 7, seed metal deposition of a seed layer 146 (for instance made of an AlCu material) of electrically conductive material is carried out. This seed metal deposition prepares or forms the basis of a subsequent electroless plating procedure (compare FIG. 9). In other words, FIG. 7 shows the result of a seed metal deposition, which can be considered as a first partial process of the formation of the below described electrically conductive contact structure 112. As can be taken from FIG. 7, formation of seed layer 146 is performed on exposed surface portions of the semiconductor wafer 106.

As indicated schematically in FIG. 7 with dotted lines and reference numeral 195, it is—alternatively to the described process flow of the present embodiment—possible in other exemplary embodiments that an electrically insulating membrane (such as a silicon nitride membrane) remains present above the trenches 102 during the process of connecting carrier wafer 100 and semiconductor wafer 106 with their trenches 102 and through holes 130. Such an electrically insulating membrane may support a process of patterning seed layer 146. In particular, such an electrically insulating membrane may allow to carry out a patterning procedure using a resist which is securely prevented from flowing into the trenches 102 by the membrane covering the trenches 102. Such a silicon nitride membrane may also serve as a layer for an oxygen etching process during formation of the through holes 130.

Figure 8:
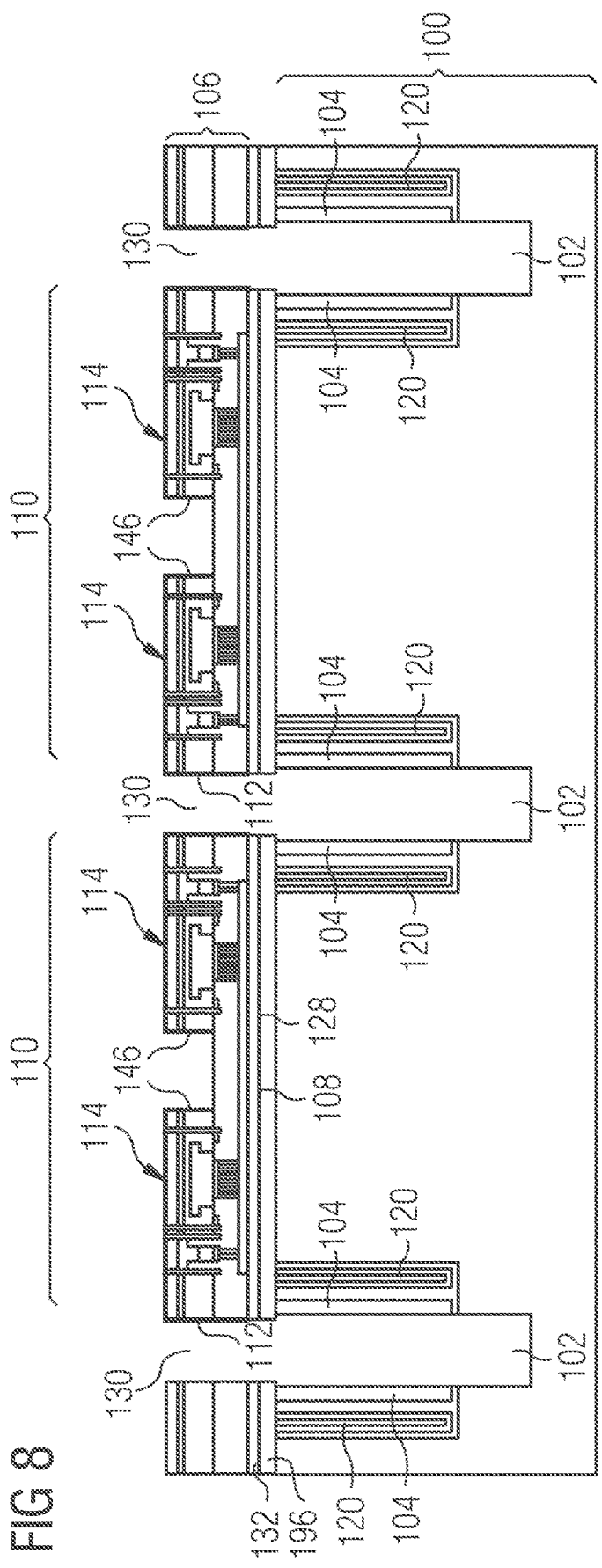

The structure shown in FIG. 8 is obtained after an optional silicon nitride removal process.

Figure 9:
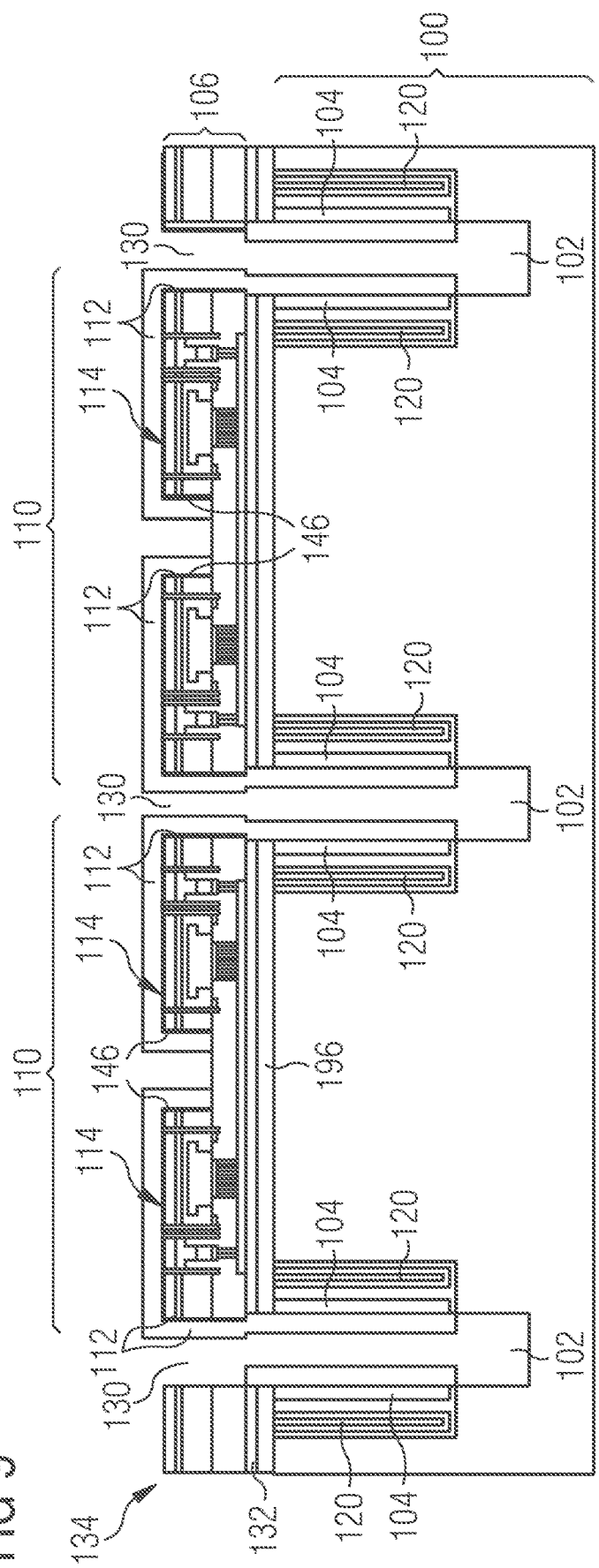

Referring to FIG. 9, formation of the electrically conductive connection structure 112, which has already been partially done by forming the metal seed layer 146, is completed by carrying out an electroless plating process. By such an electroless plating process, an electrically conductive material such as NiP/Pd/Au may be deposited. As can be taken from FIG. 9, the electrically conductive connection structure 112 is formed to electrically connect the electrically conductive sidewall coating 104 with the integrated circuit elements 114 (in particular for accomplishing an electric connection to the backside of the semiconductor devices 118 under manufacture) of the electronic chips 110. In the shown embodiment, the electrically conductive connection structure 112 fully bridges a gap between the electrically conductive sidewall coating 104 and the integrated circuit elements 114 of the electronic chips 110. More precisely, the electrically conductive connection structure 112 uninterruptedly bridges or closes the previously existing gap between the electrically conductive sidewall coating 104 and the integrated circuit elements 114. Descriptively speaking, the material of the electrically conductive connection structure 112 is grown to also extend beyond the thin gap which had previously been existent between the sidewall coating 104 on the one hand and the metal seed layer 146 on the other hand. However, it is alternatively also possible that the portion of the electrically conductive connection structure 112 grown by electroless plating is present only on the sidewall coating 104 and on the metal seed layer 146 without bridging the mentioned gap. Such an embodiment, which is illustrated in FIG. 13, also works from an electrical point of view, since an electrically conductive solder structure 148 may bridge such a gap (compare reference numeral 190 in FIG. 13) upon establishing a solder connection between a readily manufactured semiconductor device 118 and a (for instance PCB type) device carrier 147. For example, the mentioned gap may have a width of several micrometers, typically 2 µm to 3 µm, in some embodiments 10 µm to 15 µm.

As described, the electrically conductive connection structure 112 is formed in the present embodiment by seed metal deposition (compare reference numeral 146) followed by electroless plating (see FIG. 9). As an alternative, the electrically conductive connection structure 112 may also be formed in a single process. Hence, in order to obtain the structure shown in FIG. 9, an electroless plating procedure is carried out. Thereby, electrically conductive material is deposited on the seed layer 146 and on the electrically conductive sidewall coating 104 as well as on a surface portion in between, so that—in the shown embodiment—the integrated circuit elements 114 of the electronic chips 110 of the semiconductor wafer 106 are electrically coupled with the electrically conductive sidewall coating 104 via the electrically conductive connection structure 112.

As a result of the described manufacturing method, intermediate product 134 as shown in FIG. 9 is obtained. The intermediate product 134 includes the carrier wafer 100 with the plurality of trenches 102. Each of the trenches 102 is partially covered with a respective electrically conductive sidewall coating 104. The semiconductor wafer 106 is bonded on the front side 108 of the carrier wafer 100 so that each of the plurality of electronic chips 110 of the semiconductor wafer 106 is aligned with respect to respective ones of the trenches 102. The electrically conductive connection structure 112 electrically connects the electrically conductive sidewall coating 104 with the integrated circuit elements 114 of the electronic chips 110.

Figure 10:
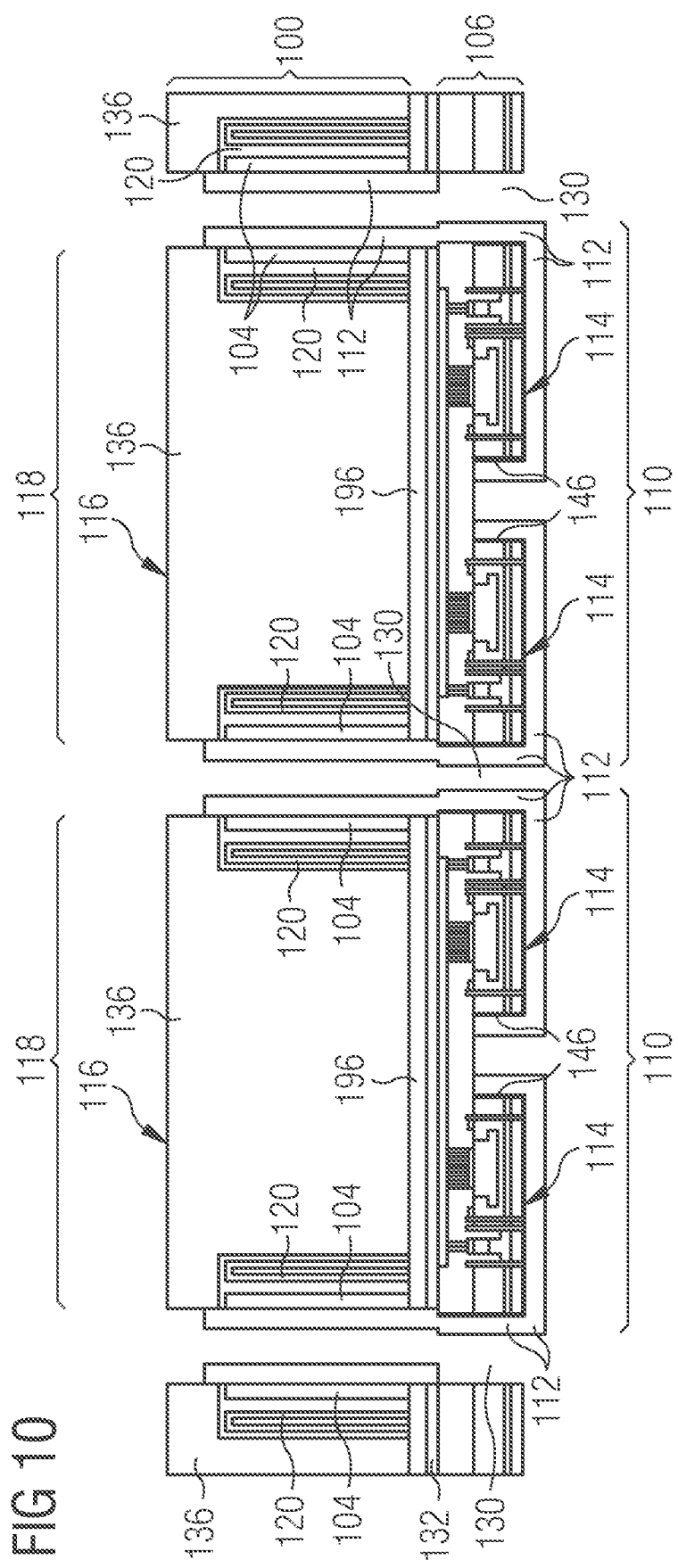

Referring to FIG. 10, the intermediate product 134 shown in FIG. 9 is separated into multiple individual semiconductor devices 118, thereby completing the described efficient high throughput batch procedure of manufacturing a large plurality of semiconductor devices 118 on wafer level.

In terms of the described separation procedure, material of the carrier wafer 100 is removed from a backside 116 of the carrier wafer 100 to thereby singularize the bonded wafers 100, 106 at the trenches 102 and the corresponding through holes 130 into the individual semiconductor devices 118. In the shown embodiment, the material is removed by grinding. Hence, the individual semiconductor devices 118 shown in FIG. 10 are obtained by carrying out a dicing by grinding procedure.

As a result, multiple non-encapsulated semiconductor devices 118, configured as Chip-Scale-Package (CSP), according to an exemplary embodiment are obtained. Each of the semiconductor devices 118 comprises a section of the previous carrier wafer 100, which section may be denoted as carrier body 136. The respective carrier body 136 is foreseen with a sidewall which is partially covered with the electrically conductive sidewall coating 104 which can be used advantageously for soldering the semiconductor device 118 on a device carrier 147 (compare FIG. 13 and FIG. 14). Descriptively speaking, the sidewall portion of the electrically conductive connection structure 112 may serve as a solder aid upon establishing a solder connection between the semiconductor device 118 and a device carrier 147. This holds in particular when the bottom side portion of the electrically conductive connection structure 112 becomes relatively small following the trend of continued miniaturization of semiconductor devices 118. A respective one of the electronic chips 110 (previously forming part of the semiconductor wafer 106) is bonded on a base wall (which may in particular be a wall, such as a bottom wall or a top wall, perpendicular to a side wall) of the carrier body 136 by a corresponding section of the adhesive material 132. A respective portion of the electrically conductive connection structure 112 also forms part of each semiconductor device 118 and electrically connects the electrically conductive sidewall coating 104 with a respective one of the integrated circuit elements 114. As can be taken from FIG. 10, two opposing sidewalls of the carrier body 136 are covered partially with the electrically conductive sidewall coating 104.

Figure 11:
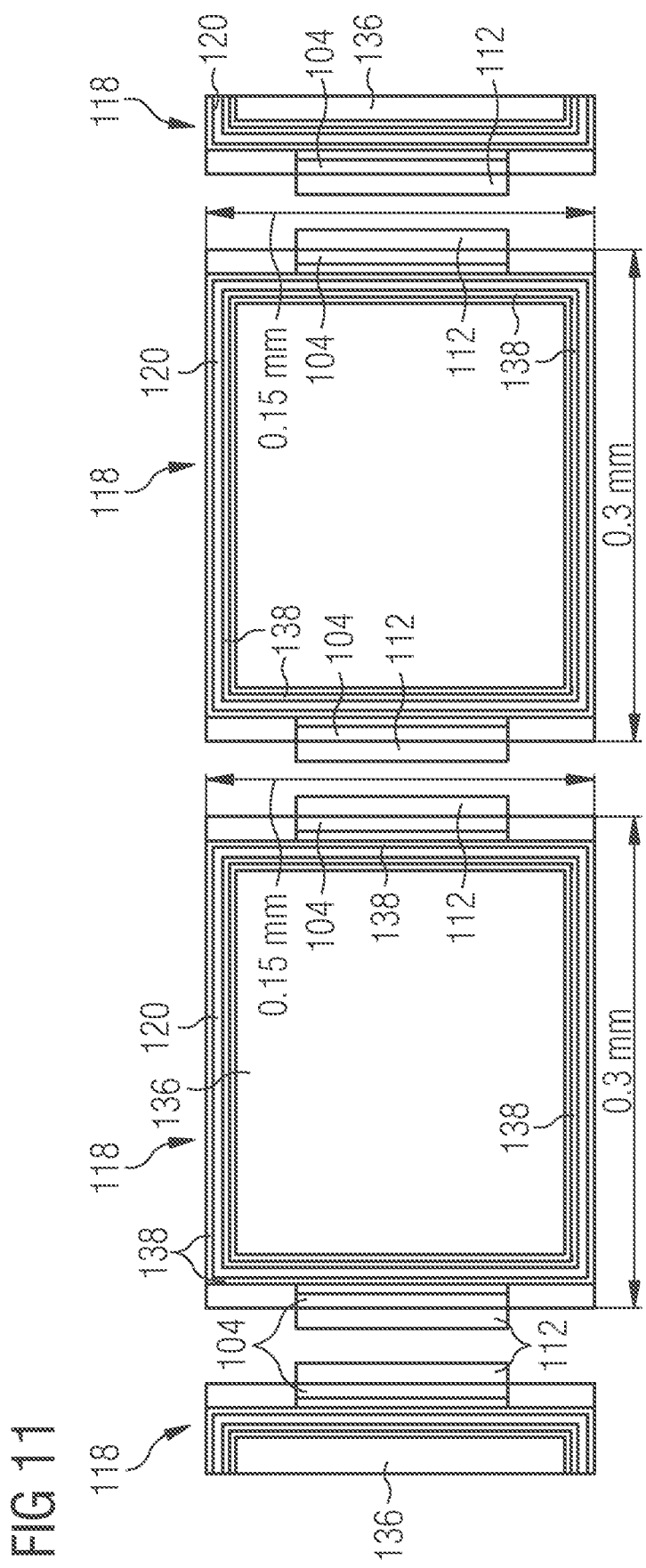
FIG. 11 show a top view of semiconductor devices according to an exemplary embodiment obtained as a result of the manufacturing method according to FIG. 1 to FIG. 10.

FIG. 11 show a top view of the semiconductor devices 118 according to FIG. 10 obtained as a result of the manufacturing method according to FIG. 1 to FIG. 10. FIG. 12 show a side view of the semiconductor devices 118 according to FIG. 11. FIG. 11 and FIG. 12 hence show the singularized semiconductor devices 118 as obtained from the procedure described above referring to FIG. 1 to FIG. 10.

As shown in FIG. 11, the semiconductor devices 118 comprise a circumferentially closed electrically insulating annulus 138 formed by the electrically insulating material 120 and sandwiched between the electrically conductive sidewall coating 104 and the carrier body 136. The electrically conductive connection structure 112 as well as the electrically conductive sidewall coating 104 only cover two opposing side wall regions of the semiconductor device 118 rather than circumferentially surrounding the entire carrier body 136. However, alternatively, the electrically conductive connection structure 112 as well as the electrically conductive sidewall coating 104 may also cover only one sidewall region of the semiconductor device 118, or three or four sidewall regions thereof. The fully circumferential isolation of the semiconductor devices 118 ensured by the circumferentially closed electrically insulating annulus 138 beneath the electrically conductive sidewall coating 104 and the electrically conductive connection structure 112 efficiently prevents undesired electric paths and thereby improves the electrical reliability.

As can be seen in FIG. 11, a surface area of the semiconductor device 118 can be as small as 0.3 mm×0.15 mm without compromising on the capability of the semiconductor device 108 to be mounted on a device carrier 147 by soldering.

Figure 12:
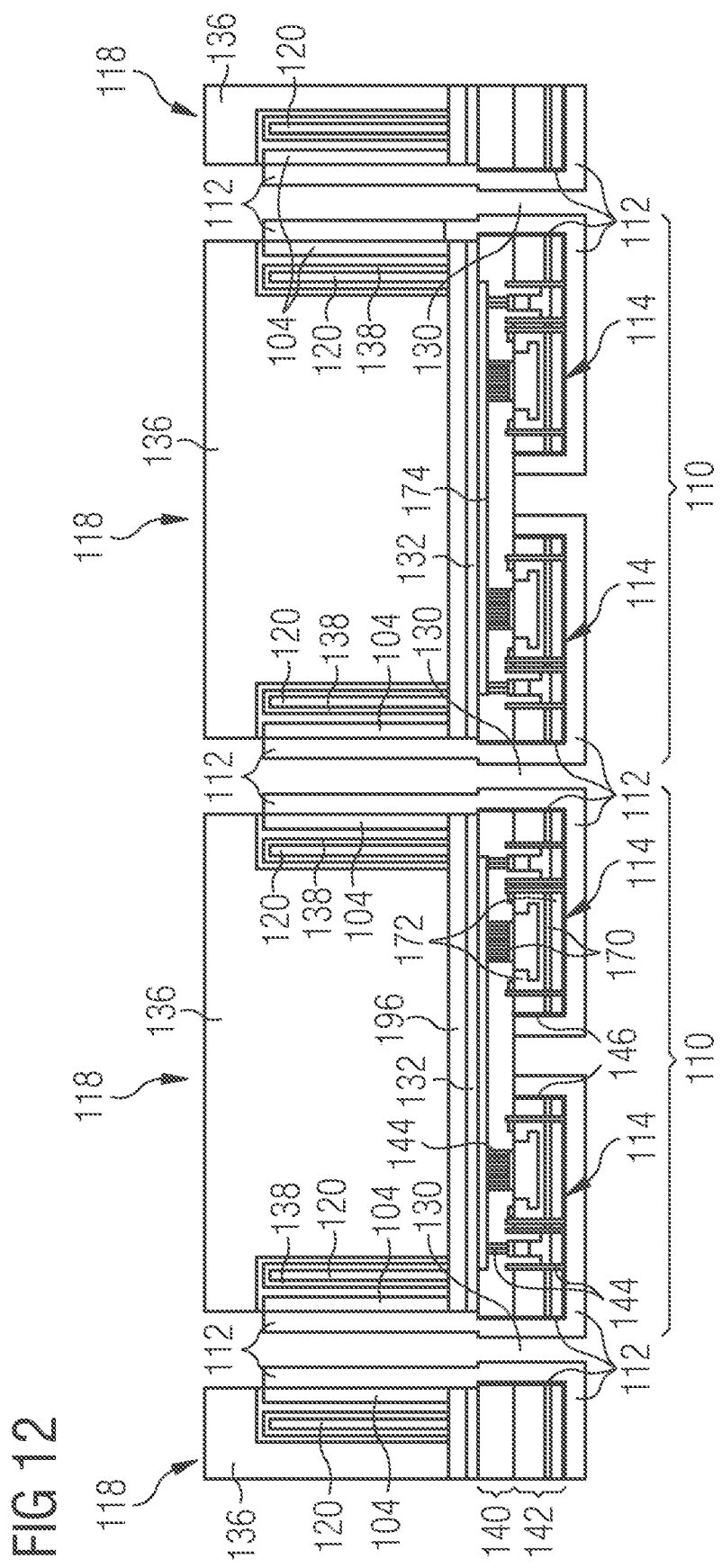
FIG. 12 show a side view of the semiconductor devices according to FIG. 11.

Referring to FIG. 12, further details concerning construction of the electronic chips 110 and their integrated circuit elements 114 will be described. It should be emphasized that the described manufacturing concept is compatible with very different constructions concerning electronic chips 110 and corresponding integrated circuit elements 114. As can be taken from FIG. 12, p-doped silicon structures 170 and n-doped silicon structures 172 are provided. Furthermore, a metal connection layer 174 is provided.

FIG. 12 shows that the electrically conductive connection structure 112 comprises vertically extending sidewall sections and horizontally extending base wall sections extending perpendicular to and continuously with the sidewall sections. The electrically conductive connection structure 112 is therefore an angled continuous structure.

FIG. 13 shows a cross-sectional view of an electronic device 143 according to an exemplary embodiment. The electronic device 143 is composed of a Chip-Scale-Package, embodied as surface mounted non-encapsulated semiconductor device 118, and a printed circuit board (PCB), as device carrier 147 for carrying the semiconductor device 118. The electric and mechanical coupling between the semiconductor device 118 and the device carrier 147 is accomplished by the electrically conductive connection structures 112 interconnecting the semiconductor device 118 with device carrier pads 150 on an exposed top main surface of the plate like device carrier 147.

According to FIG. 13, the electrically conductive connection structure 112 bridges only part of the gap between the electrically conductive sidewall coating 104 and the integrated circuit element 114 so that an electrically nonconductive space 190 remains in between. Nevertheless, during establishing the solder connection between device carrier 147 and semiconductor device 118, the electrically conductive solder structure 148 provides an electric coupling between the electrically conductive sidewall coating 104 and the portion of the electrically conductive connection structure 112 above the gap 190 on the one hand and the portion of the electrically conductive connection structure 112 below the gap 190. In other words, both the bottom wall as well as the side wall of the semiconductor device 118 are here used for providing surface portions for establishing the solder connection between the semiconductor device 118 and the device carrier 147. This promotes the freedom of design when further miniaturizing the semiconductor device 118 without deteriorating the electrical reliability when the semiconductor device 118 is soldered on the device carrier 147. According to FIG. 13, the non-encapsulated semiconductor device 118 is mechanically mounted on and electrically coupled with the device carrier 147 partially by the portion of the electrically conductive connection structure 112 covering the sidewall coating 104 and therefore forming part of the side surface of the semiconductor device 118, and partially by the portion of the electrically conductive connection structure 112 on a bottom surface of the semiconductor device 118. Solder structure 148 connects the device carrier 147 with the electrically conductive contact structure 112 on both a side surface and a bottom surface of the semiconductor device 118.

As can be taken from FIG. 13, the mounting of the semiconductor device 118 on PCB type device carrier 147 is established via the electrically conductive contact structure 112, supported by the electrically conductive sidewall coating 104. Thereby, it is possible to provide the device carrier 147 with a sufficiently large coupling area, since the dimension of the sidewall contacts of the semiconductor device 118 can be freely determined and defined via the depth D of trench 102. At the same time, the semiconductor device 118 may be formed highly compact, since there is no need to keep the silicon area larger than necessary for the manufacturing technology.

FIG. 14 shows a cross-sectional view of an electronic device 143 and a leadframe type device carrier 147 according to another exemplary embodiment. The embodiment of FIG. 14 differs from the embodiment of FIG. 13 in that the device carrier 147 of FIG. 14 is embodied as a copper leadframe with a central through hole 152. The different separate sections of the connection structure 112 shown on the left-hand side and on the right-hand side of FIG. 14, respectively, are connected by a solder structure 148 (alternatively by an electrically conductive glue connection) with the different sections of the leadframe type device carrier 147. Furthermore, as indicated by reference numeral 192, the electrically conductive connection structure 112 uninterruptedly electrically connects the electrically conductive sidewall coating 104 with the respective integrated circuit element 114 (rather than involving a gap 190).

It should be noted that the term "comprising" does not exclude other elements or features and the "a" or "a" does not exclude a plurality. Also elements described in association with different embodiments may be combined. It should also be noted that reference signs shall not be construed as limiting the scope of the claims. Moreover, the scope of the present application is not intended to be limited to the particular embodiments of the process, machine, manufacture, and composition of matter, means, methods and steps described in the specification. Accordingly, the appended claims are intended to include within their scope such processes, machines, manufacture, compositions of matter, means, methods, or steps.

What is claimed is:

1. A manufacturing method, comprising:
   forming a carrier wafer with a plurality of trenches, each trench being at least partially covered with an electrically conductive sidewall coating;
   bonding a semiconductor wafer on a front side of the carrier wafer so that each of a plurality of electronic chips of the semiconductor wafer is aligned with respect to a respective one of the trenches;
   forming an electrically conductive connection structure at least partially bridging a gap between the electrically conductive sidewall coating and an integrated circuit element of a respective one of the electronic chips; and
   removing material on a backside of the carrier wafer to thereby singularize the bonded wafers at the trenches into a plurality of semiconductor devices.

2. The method according to claim 1, wherein the method comprises forming the carrier wafer by
   forming first auxiliary trenches and filling the first auxiliary trenches at least partially with electrically insulating material;
   forming second auxiliary trenches laterally neighboured to the first auxiliary trenches and filling the second auxiliary trenches at least partially with the electrically conductive sidewall coating; and
   subsequently forming the trenches between respectively two neighboured second auxiliary trenches so that two opposing sidewalls of the respective trench are at least partially covered with the electrically conductive sidewall coating.

3. The method according to claim 2, wherein the method comprises forming the trenches extending deeper into the carrier wafer than the first auxiliary trenches and the second auxiliary trenches.

4. The method according to claim 2, wherein the first auxiliary trenches are filled with the electrically insulating material by oxidizing exposed walls of the carrier wafer followed by deposition of further electrically insulating material.

5. The method according to claim 2, wherein the second auxiliary trenches are partially filled with electrically insulating material by oxidizing exposed walls of the carrier wafer.

6. The method according to claim 1, wherein the method comprises bonding the semiconductor wafer on the front side of the carrier wafer so that the integrated circuit elements are exposed on a main surface of the semiconductor wafer opposing a bonding surface of the semiconductor wafer.

7. The method according to claim 1, wherein the method comprises forming through holes in the semiconductor wafer so that the through holes flush with the trenches.

8. The method according to claim 1, wherein the method comprises forming the electrically conductive connection structure by seed metal deposition followed by electroless plating.

9. The method according to claim 1, wherein the method comprises bonding the semiconductor wafer on the carrier wafer by adhesive material, in particular by electrically insulating adhesive material.

10. The method according to claim 1, wherein the method comprises removing the material of the carrier wafer by grinding.

11. The method according to claim 1, wherein the electrically conductive connection structure is formed to uninterruptedly electrically connect the electrically conductive sidewall coating with the integrated circuit element.

12. The method according to claim 1, wherein a surface of each of the plurality of semiconductor devices has an area of not more than 0.3 mm×0.15 mm.

13. The method according to claim 1, wherein the electrically conductive connection structure at least comprises a base wall section extending perpendicular to the electrically conductive sidewall coating.

14. The method according to claim 1, wherein the electrically conductive connection structure at least comprises at least one sidewall section and at least one base wall section extending perpendicular to at least one sidewall section.

15. The method according to claim 1, wherein each of the plurality of semiconductor devices comprises a non-encapsulated semiconductor device.

16. The method according to claim 1, wherein the carrier wafer comprises glass.

17. The method according to claim 1, wherein the method comprises mounting a semiconductor device of the plurality of semiconductor devices to a device carrier.

18. The method according to claim 17, wherein the semiconductor device of the plurality of semiconductor devices is mounted on the device carrier at least partially by a portion of the electrically conductive connection structure.

19. The method according to claim 17, wherein the device carrier comprises one of the group consisting of a printed circuit board and a leadframe.

20. The method according to claim 17, wherein the semiconductor device of the plurality of semiconductor devices is mounted on the device carrier by a solder structure connecting the device carrier with the electrically conductive connection structure.

* * * * *